United States Patent
Oshima

(10) Patent No.: US 11,871,508 B2
(45) Date of Patent: Jan. 9, 2024

(54) RADIO-FREQUENCY MODULE AND COMMUNICATION DEVICE

(71) Applicant: Murata Manufacturing Co., Ltd., Kyoto (JP)

(72) Inventor: Takayuki Oshima, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/815,987

(22) Filed: Jul. 29, 2022

(65) Prior Publication Data

US 2022/0369453 A1 Nov. 17, 2022

Related U.S. Application Data

(63) Continuation of application No. PCT/JP2020/045540, filed on Dec. 7, 2020.

(30) Foreign Application Priority Data

Mar. 26, 2020 (JP) ................................. 2020-056561

(51) Int. Cl.
*H05K 1/02* (2006.01)

(52) U.S. Cl.
CPC ......... *H05K 1/0243* (2013.01); *H05K 1/0216* (2013.01); *H05K 2201/10734* (2013.01)

(58) Field of Classification Search
CPC ............... H05K 1/0243; H05K 1/0216; H05K 2201/10734
USPC ........................................................ 361/760
See application file for complete search history.

(56) References Cited

U.S. PATENT DOCUMENTS

| | | | |
|---|---|---|---|
| 2014/0252568 A1* | 9/2014 | Hwang | H05K 9/0007 257/659 |
| 2017/0194937 A1 | 7/2017 | Iwamoto | |
| 2018/0190601 A1 | 7/2018 | Hitomi et al. | |
| 2019/0052301 A1* | 2/2019 | Goetz | H01L 25/18 |

(Continued)

FOREIGN PATENT DOCUMENTS

| | | | | |
|---|---|---|---|---|
| JP | 2005-072204 A | | 3/2005 | |
| JP | 2005072204 A | * | 3/2005 | |
| JP | 2008288523 A | * | 11/2008 | ........... H01L 23/053 |

(Continued)

OTHER PUBLICATIONS

International Search Report for PCT/JP2020/045540 dated Feb. 9, 2021.

*Primary Examiner* — Andargie M Aychillhum
(74) *Attorney, Agent, or Firm* — Pearne & Gordon LLP

(57) ABSTRACT

There is provided a radio-frequency module and a communication device with which miniaturization can be achieved and quality deterioration can be suppressed. A radio-frequency module includes a mount board on which a ground terminal is disposed, a first chip, a second chip, and a cover (a shield cover). The first chip is disposed on the mount board. The second chip is disposed on the first chip. The cover covers at least a part of the first chip and at least a part of the second chip. The second chip has a first connection terminal (a ground terminal) on an opposite side from the first chip in a thickness direction of the mount board. The cover includes a shield layer connected to the ground terminal disposed on the mount board. The first connection terminal is connected to the shield layer.

20 Claims, 3 Drawing Sheets

(56) References Cited

U.S. PATENT DOCUMENTS

2021/0082782 A1* 3/2021 Wang .................. H01L 21/6835

FOREIGN PATENT DOCUMENTS

| JP | 2016-514368 A | 5/2016 |
| WO | 2016/060072 A1 | 4/2016 |
| WO | 2017/033564 A1 | 3/2017 |

\* cited by examiner

RADIO-FREQUENCY MODULE AND COMMUNICATION DEVICE

CROSS REFERENCE TO RELATED APPLICATION

This is a continuation of International Application No. PCT/JP2020/045540 filed on Dec. 7, 2020 which claims priority from Japanese Patent Application No. 2020-056561 filed on Mar. 26, 2020. The contents of these applications are incorporated herein by reference in their entireties.

BACKGROUND OF THE DISCLOSURE

Field of the Disclosure

The present disclosure generally relates to radio-frequency modules and communication devices and more particularly, to a radio-frequency module and a communication device each including a mount board and a plurality of chips.

Description of the Related Art

A semiconductor package (radio-frequency module) in which semiconductor chips are stacked has been known (see Patent Document 1).

Referring to Patent Document 1, protruding electrodes of a semiconductor chip are bonded on a wiring layer of a flexible board to mount the semiconductor chip in a semiconductor chip mount region of the flexible board, semiconductor chips mounted on respective flexible boards are stacked on a carrier board, and the flexible boards are bent to be connected to the carrier board.

As a result, the reduction in profile and size of a semiconductor package can be achieved.

Patent Document 1: Japanese Unexamined Patent Application Publication No. 2005-72204

BRIEF SUMMARY OF THE DISCLOSURE

When a semiconductor package (radio-frequency module) is miniaturized, the distance between chips and the distance between components are reduced. For example, a certain chip becomes susceptible to a magnetic field generated by a component such as an inductor. This may lead to the reduction in quality of the semiconductor package.

The present disclosure has been made in view of the above problem, and it is a possible benefit of the present disclosure to provide a radio-frequency module and a communication device with which miniaturization can be achieved and quality deterioration can be suppressed.

A radio-frequency module according to an aspect of the present disclosure includes a mount board on which a ground terminal is disposed, a first chip, a second chip, and a cover. The first chip is disposed on the mount board. The second chip is disposed on the first chip. The cover covers at least a part of the first chip and at least a part of the second chip. The second chip has a first connection terminal on an opposite side from the first chip in a thickness direction of the mount board. The cover includes a shield layer connected to the ground terminal disposed on the mount board. The first connection terminal is connected to the shield layer.

A communication device according to an aspect of the present disclosure includes the above radio-frequency module and a signal processing circuit configured to process a signal used for communication.

According to the present disclosure, miniaturization can be achieved and quality deterioration can be suppressed.

DETAILED DESCRIPTION OF THE DISCLOSURE

Figure 1A:
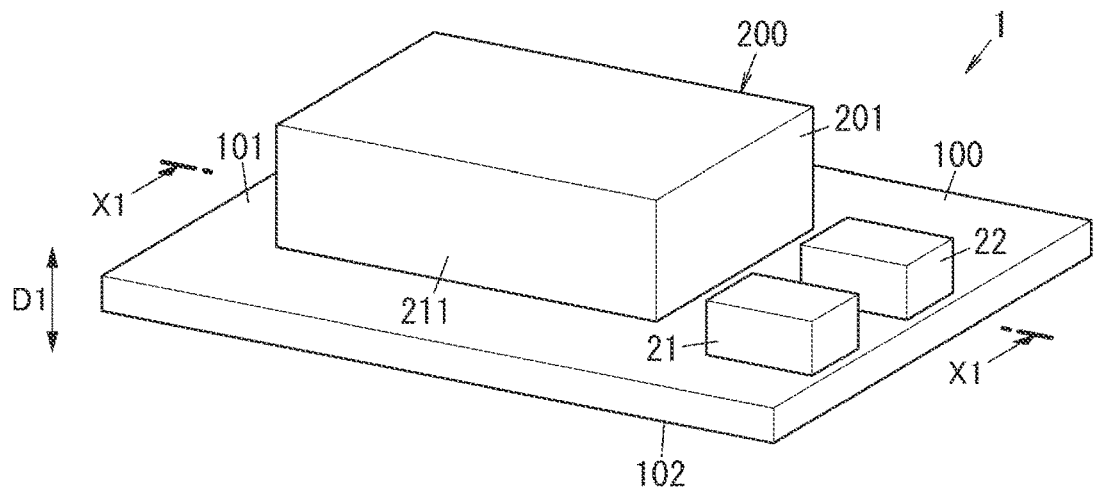
FIG. 1A is a schematic perspective view of a radio-frequency module according to an embodiment.

FIGS. 1A to 6 referred to in the following embodiment are all schematic drawings, and the ratios between the sizes, thicknesses, and so forth of constituent elements in the drawings do not necessarily reflect the actual dimensional ratios.

Embodiment

A radio-frequency module 1 according to this embodiment and a communication device 500 according to this embodiment will be described with reference to FIGS. 1A to 3.

(1) Overall Configuration of Radio-Frequency Module

The radio-frequency module 1 according to this embodiment is used in, for example, the multimode multiband communication device 500. The communication device 500 is, but is not limited to, for example, a mobile phone (e.g., a smartphone) and may be, for example, a wearable terminal (e.g., a smart watch). The radio-frequency module 1 is a module supporting, for example, the 4G (4th generation mobile communication) standard and the 5G (5th generation mobile communication) standard. The 4G standard is, for example, the 3GPP LTE (long term evolution) standard. The 5G standard is, for example, 5G NR (new radio). The radio-frequency module 1 is a module supporting carrier aggregation and dual connectivity.

The radio-frequency module 1 is configured to, for example, amplify a transmission signal inputted from a signal processing circuit 3 and output the amplified signal to an antenna 4. The radio-frequency module 1 is also configured to amplify a reception signal inputted from the antenna 4 and output the amplified signal to the signal processing circuit 3. The signal processing circuit 3 is not a constituent element in the radio-frequency module 1 but a constituent element in the communication device 500 including the radio-frequency module 1. The radio-frequency module 1 according to an embodiment is controlled by, for example, the signal processing circuit 3 included in the communication device 500. The communication device 500 includes the radio-frequency module 1 and the signal processing circuit 3. The communication device 500 further includes the antenna 4. The signal processing circuit 3 processes a signal (reception signal) received via the antenna 4 and a signal (transmission signal) to be transmitted via the antenna 4.

(2) Each Constituent Element in Radio-Frequency Module

Each constituent element in the radio-frequency module 1 will be described with reference to the drawings.

Figure 1B:
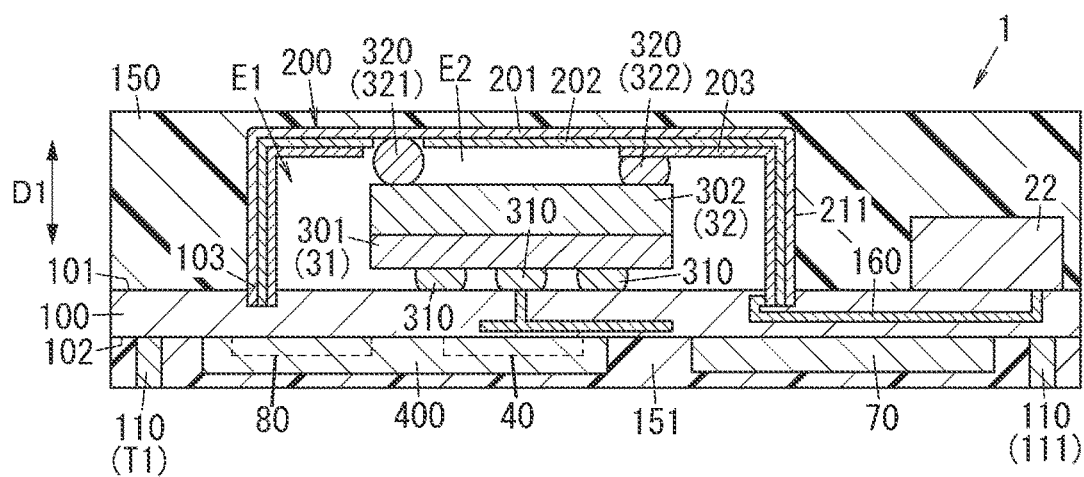
FIG. 1B is a cross-sectional view taken along line X1-X1 in FIG. 1A.
Figure 3:
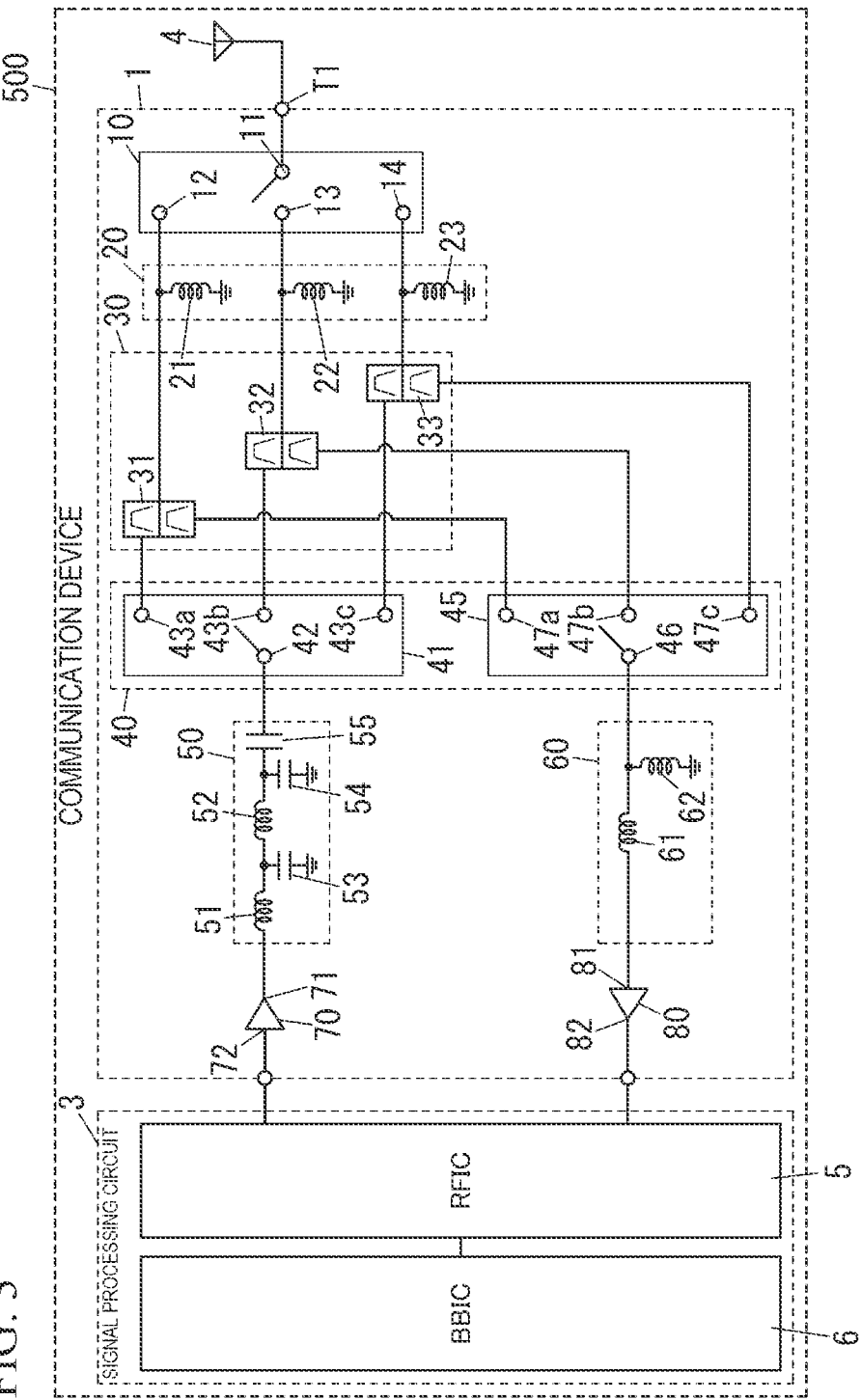
FIG. 3 is a schematic circuit diagram describing a communication device including the above radio-frequency module.

As illustrated in FIGS. 1A, 1B, and 3, the radio-frequency module 1 according to this embodiment includes a mount board 100, a shield cover 200 (cover), an antenna terminal T1, an antenna switch 10, a first matching circuit 20, a filter group 30, a switch 40, a second matching circuit 50, a third matching circuit 60, a power amplifier 70, and a low-noise amplifier 80. The radio-frequency module 1 further includes a plurality of external connection terminals 110 (see FIG. 1B).

The antenna terminal T1 is electrically connected to the antenna 4 as illustrated in FIG. 3.

The antenna switch 10 selects, as a signal path to be connected to the antenna 4, at least one of signal paths for a plurality of communication bands. The antenna switch 10 includes, as illustrated in FIG. 3, a common terminal 11 and a plurality of (three in the drawing) selection terminals 12 to 14 (see FIG. 3). The common terminal 11 is electrically connected to the antenna terminal T1. The selection terminal 12 is connected to a filter 31 in the filter group 30. The selection terminal 13 is connected to a filter 32 in the filter group 30. The selection terminal 14 is connected to a filter 33 in the filter group 30.

The antenna switch 10 selects, as a connection destination of the common terminal 11, at least one of the multiple selection terminals: the selection terminals 12 to 14. That is, the antenna switch 10 selectively connects the antenna 4 to one of the filters 31, 32, and 33.

The antenna switch 10 is controlled by, for example, the signal processing circuit 3. The antenna switch 10 electrically connects at least one of the selection terminals: the selection terminals 12, 13, and 14 to the common terminal 11 in accordance with a control signal from an RF signal processing circuit 5 in the signal processing circuit 3.

The first matching circuit 20 includes, for example, a plurality of (three in the drawing) chip inductors 21 to 23 (see FIG. 3). Each of the chip inductors 21 to 23 is a circuit element for performing impedance matching between the antenna switch 10 and the filter group 30. Each of the chip inductors 21 to 23 has one end connected to a path connecting the antenna switch 10 and the filters 31 to 33 in the filter group 30 and the other end connected to a reference terminal (ground). In the first matching circuit 20, each of the chip inductors 21 to 23 may not be connected between the above path and the ground and may be connected in series to the above path. The first matching circuit 20 may not include the chip inductors 21 to 23 and may include capacitors or include capacitors and inductors.

The filter group 30 includes the multiple filters 31 to 33 (see FIG. 3). The multiple filters 31 to 33 are, for example, acoustic wave filters and each include a plurality of series arm resonators and a plurality of parallel arm resonators, each of which is formed of an acoustic wave resonator. The acoustic wave filter is, for example, a SAW (surface acoustic wave) filter using surface acoustic waves.

The filters 31 to 33 are duplexers. Each of the filters 31 to 33 is connected to the corresponding one of the multiple selection terminals of the antenna switch 10. Each of the filters 31 to 33 is connected to the corresponding one of a plurality of (three in the drawing) selection terminals 43a to 43c of a first switch 41 in the switch 40. Each of the filters 31 to 33 is connected to the corresponding one of a plurality of (three in the drawing) selection terminals 47a to 47c of a second switch 45 in the switch 40.

The filter 31 passes signals in a first communication band. The filter 32 passes signals in a second communication band different from the first communication band. The filter 33 passes signals in a third communication band. The first communication band is, for example, Band3 in the 4G standard. The second communication band is, for example, Band8 in the 4G standard. The third communication band is, for example, Band1 in the 4G standard.

The filter 31 is formed as one chip and hereinafter also referred to as a first chip 301 (see FIG. 1B). The filter 32 is formed as one chip and hereinafter also referred to as a second chip 302 (see FIG. 1B). The filter 33 is formed as one chip and hereinafter also referred to as a third chip.

The switch 40 is, for example, a switch IC (integrated circuit). The switch 40 includes the first switch 41 and the second switch 45 (see FIG. 3).

The first switch 41 has a common terminal 42 and the multiple (three in the drawing) selection terminal 43a to 43c. The first switch 41 switches between the connections of the common terminal 42 to the selection terminals 43a to 43c. The common terminal 42 is connected to the power amplifier 70. Specifically, the common terminal 42 is connected to the power amplifier 70 via the second matching circuit 50. The multiple selection terminals 43a to 43c are connected to the multiple filters 31 to 33 in the filter group 30, respectively. In this embodiment, the selection terminal 43a is connected to the filter 31, the selection terminal 43b is connected to the filter 32, and the selection terminal 43c is connected to the filter 33. The first switch 41 electrically connects the common terminal 42 and one of the selection terminals 43a to 43c in accordance with a control signal from the RF signal processing circuit 5 in the signal processing circuit 3.

The second switch 45 has a common terminal 46 and the multiple (three in the drawing) selection terminals 47a to 47c. The second switch 45 switches between the connections of the common terminal 46 to the selection terminals 47a to 47c. The common terminal 46 is connected to the low-noise amplifier 80. Specifically, the common terminal 46 is connected to the low-noise amplifier 80 via the third matching circuit 60. The multiple selection terminals 47a to 47c are connected to the multiple filters 31 to 33 in the filter group 30, respectively. In this embodiment, the selection terminal 47a is connected to the filter 31, the selection terminal 47b is connected to the filter 32, and the selection terminal 47c is connected to the filter 33. The second switch 45 electrically connects the common terminal 46 and one of the selection terminals 47a to 47c in accordance with a control signal from the RF signal processing circuit 5 in the signal processing circuit 3.

The second matching circuit 50 includes, for example, a plurality of (two in the drawing) inductors 51 and 52 and a plurality of (three in the drawing) capacitors 53 to 55. The second matching circuit 50 performs impedance matching between the first switch 41 and the power amplifier 70.

The inductor 51 is formed of a wiring pattern. One end of the inductor 51 is connected to an output terminal 71 of the power amplifier 70. The other end of the inductor 51 is connected to the common terminal 42 of the first switch 41 in the switch 40.

The inductor 52 is a chip inductor formed of a coil. One end of the inductor 52 is connected to the output side of the power amplifier 70. Specifically, one end of the inductor 52 is connected to the output terminal 71 of the power amplifier 70 via the inductor 51. The other end of the inductor 52 is connected to the common terminal 42 of the first switch 41.

One end of the capacitor 53 is connected to a path between the inductors 51 and 52. The other end of the capacitor 53 is connected to a reference terminal (ground). One end of the capacitor 54 is connected to a path between the inductor 52 and the common terminal 42. The other end of the capacitor 54 is connected to a reference terminal (ground). The capacitor 54 is provided between the inductor 52 and the common terminal 42. Specifically, the capacitor 54 is provided between the common terminal 42 and a node between the capacitor 53 and the path between the inductor 52 and the common terminal 42. One end of the capacitor 55 is connected to the inductor 52. The other end of the capacitor 55 is connected to the common terminal 42. At that time, one end of the capacitor 54 is connected to a path between the inductor 52 and the capacitor 55.

The third matching circuit 60 includes, for example, a plurality of (two in the drawing) chip inductors 61 and 62. The chip inductors 61 and 62 are circuit elements for performing impedance matching between the second switch 45 and the low-noise amplifier 80. One end of the chip inductor 61 is connected to the input side of the low-noise amplifier 80. Specifically, one end of the chip inductor 61 is connected to an input terminal 81 of the low-noise amplifier 80. The other end of the chip inductor 61 is connected to the common terminal 46 of the second switch 45. One end of the chip inductor 62 is connected to a path between the chip inductor 61 and the common terminal 46. That is, one end of the chip inductor 62 is connected to the input side of the low-noise amplifier 80 via the chip inductor 61. The other end of the chip inductor 62 is connected to a reference terminal (ground).

The power amplifier 70 amplifies a signal (transmission signal) to be transmitted from the antenna 4. The power amplifier 70 is formed as one chip. An input terminal 72 of the power amplifier 70 is connected to the signal processing circuit 3. The output terminal 71 of the power amplifier 70 is connected to the second matching circuit 50. The power amplifier 70 amplifies a signal outputted from the signal processing circuit 3. The power amplifier 70 outputs the amplified transmission signal to the first switch 41 via the second matching circuit 50.

The low-noise amplifier 80 amplifies a signal (reception signal) received by the antenna 4. The low-noise amplifier 80 is formed as one chip. The input terminal 81 of the low-noise amplifier 80 is connected to the third matching circuit 60. An output terminal 82 of the low-noise amplifier 80 is connected to the signal processing circuit 3. The low-noise amplifier 80 amplifies a signal (reception signal) that has passed through one of the filters 31 to 33 and the third matching circuit 60. The low-noise amplifier 80 outputs the amplified reception signal to the signal processing circuit 3.

In this embodiment, the antenna switch 10, the switch 40, and the low-noise amplifier 80 are formed as one chip and form an IC chip 400 (see FIG. 1B).

The multiple external connection terminals 110 connect the radio-frequency module 1 to a mother board on which the signal processing circuit 3 and other components are disposed. The multiple external connection terminals 110 are columnar (e.g., cylindrical) electrodes provided on the mount board 100. The material of the multiple external connection terminals 110 is, for example, metal (e.g., copper or an alloy of copper). The multiple external connection terminals 110 include the antenna terminal T1 and a plurality of ground terminals 111 used for the connection to the ground. FIG. 1B illustrates the one ground terminal 111.

The radio-frequency module 1 receives a signal received by the antenna 4 via the antenna terminal T1 that is one of the multiple external connection terminals 110 and outputs the received signal to the RF signal processing circuit 5 in the signal processing circuit 3 via another one of the external connection terminals 110.

The mount board 100 has, as illustrated in FIGS. 1A and 1B, a first main surface 101 and a second main surface 102 that face each other in a thickness direction D1 of the mount board 100. The mount board 100 is, for example, a printed wiring board, an LTCC (low temperature co-fired ceramic) substrate, an HTCC (high temperature co-fired ceramic) substrate, or a resin substrate (e.g., glass epoxy substrate). Here, the mount board 100 is, for example, a multilayer substrate including a plurality of dielectric layers and a plurality of conductive layers. The multiple dielectric layers and the multiple conductive layers are stacked in the thickness direction D1 of the mount board 100. The multiple conductive layers are formed in respective predetermined patterns defined for each layer. Each of the multiple conductive layers includes one or more conductor portions in one plane surface orthogonal to the thickness direction D1 of the mount board 100. The material of the respective conductive layers is, for example, copper. The multiple conductive layers include a ground layer. In the radio-frequency module 1, the multiple ground terminals 111 and the ground layer are electrically connected to each other via conductors or the likes of the mount board 100.

The mount board 100 is not limited to a printed wiring board and an LTCC substrate and may be a wiring structure. The wiring structure is, for example, a multilayer structure. The multilayer structure includes at least one insulating layer and at least one conductive layer. The insulating layer is formed in a predetermined pattern. When the multiple insulating layers are provided, the multiple insulating layers are formed in respective predetermined patterns defined for each layer. The conductive layer is formed in a predetermined pattern different from the predetermined pattern of the insulating layer. When the multiple conductive layers are provided, the multiple conductive layers are formed in respective predetermined patterns defined for each layer. The conductive layer may include one or more re-wiring portions. In the wiring structure, among the two surfaces facing each other in the thickness direction of the multilayer structure, a first surface is the first main surface 101 of the mount board 100 and a second surface is the second main surface 102 of the mount board 100. The wiring structure may be, for example, an interposer. The interposer may be an interposer using a silicon substrate or a substrate formed of multiple layers.

On the first main surface 101, the first matching circuit 20, the filter group 30 (the filters 31 to 33), the second matching circuit 50, the third matching circuit 60, and the shield cover 200 are disposed.

On the second main surface 102, the multiple external connection terminals 110 are arranged (see FIG. 1B). On the second main surface 102, the antenna switch 10, the switch 40, the power amplifier 70, and the low-noise amplifier 80 are disposed as electronic components different from the first matching circuit 20, the second matching circuit 50, the third matching circuit 60, the shield cover 200, the first chip 301, the second chip 302, and the third chip. Referring to FIGS. 1A and 1B, the chip inductors 21 and 22 in the first matching circuit 20, the filter 31 (the first chip 301), and the filter 32 (the second chip 302) are illustrated as constituent elements disposed on the first main surface 101, and the illustration of the other constituent elements disposed on the first main surface 101 is omitted.

The radio-frequency module 1 further includes a first resin layer 150 on the first main surface 101 of the mount board 100 and a second resin layer 151 on the second main surface 102. The first resin layer 150 covers electronic components including the first matching circuit 20, the filter group 30 (the filters 31 to 33), the second matching circuit 50, the third matching circuit 60, and the shield cover 200 disposed on the first main surface 101. The second resin layer 151 covers electronic components including the IC chip 400 (the antenna switch 10, the low-noise amplifier 80, and the switch 40) and the power amplifier 70 disposed on the second main surface 102. In FIG. 1A, the illustration of the first resin layer 150 and the second resin layer 151 is omitted. In FIG. 1B, the illustration of the antenna switch 10 is omitted.

In this embodiment, the filter 31 is the first chip 301 formed as one chip. The first chip 301 is disposed on the mount board 100. The filter 32 is the second chip 302 formed as one chip. The second chip 302 is disposed on the first chip 301. That is, the first chip 301 and the second chip 302 are stacked in this order on the mount board 100. The first chip 301 and the second chip 302 are connected by die bonding.

The filter 31 passes signals in a first communication band that is Band3 in the 4G standard. The filter 32 passes signals in a second communication band that is Band8 in the 4G standard. The frequency band of Band3 is the 1800 MHz band, and the frequency band of Band8 is the 900 MHz band. Accordingly, it is desired that the communication frequency bands of two chips to be stacked be apart from each other as much as possible.

The second chip 302 includes, in the thickness direction D1 of the mount board 100, a plurality of external connection terminals 320 on the opposite side from the first chip 301. The multiple external connection terminals 320 include a ground terminal 321 (first connection terminal) and a Hot terminal 322 (second connection terminal) electrically connected to another electronic component.

The first chip 301 include, in the thickness direction D1 of the mount board 100, a plurality of external connection terminals 310 (third connection terminals) on the opposite side from the second chip 302. The multiple external connection terminals 310 include the ground terminal and the Hot terminal.

The shield cover 200 covers at least parts of the first chip 301 and the second chip 302. In this embodiment, the shield cover 200 covers the whole of the first chip 301 and the second chip 302.

The shield cover 200 has a rectangular box shape, one surface of which in the thickness direction D1 opens. The shield cover 200 includes a shield layer 201 that is a conductive layer, an insulating layer 202, and a wiring layer 203 that is a conductive layer. The shield layer 201 is electrically connected to the ground layer of the mount board 100. That is, the shield layer 201 is electrically connected to the ground terminal 111 disposed on the mount board 100 via the ground layer of the mount board 100. The wiring layer 203 is electrically connected to another electronic component. In this embodiment, the shield layer 201, the insulating layer 202, and the wiring layer 203 of the shield cover 200 are stacked in this order from the outer surface to the inside of the shield cover 200. That is, the shield cover 200 has a layer structure in which the shield layer 201, the insulating layer 202, and the wiring layer 203 are stacked in this order (see FIGS. 1B and 2).

The shield cover 200 is disposed on (connected to) the mount board 100 in such a manner that the end of the side surface thereof forming a side wall 211 of the shield cover 200 is fitted into and soldered to a rectangular groove 103 provided in the mount board 100. In this embodiment, a region E1 surrounded by the shield cover 200 disposed on the mount board 100 includes a cavity E2 (see FIG. 1B). Here, "cavity" in this embodiment means space inside the shield cover 200 which is not sealed with a resin. That is, the cavity E2 is space between the shield cover 200 and each of the first chip 301 and the second chip 302 in the region E1 surrounded by the shield cover 200.

Figure 2:
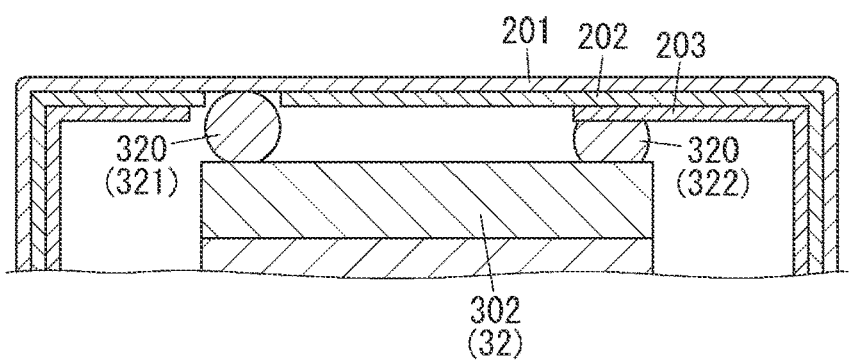
FIG. 2 is an enlarged view of a main part illustrated in FIG. 1B.

The external connection terminal 320 (first connection terminal), which is the ground terminal 321 of the second chip 302, is connected to the shield layer 201 of the shield cover 200 (see FIG. 2). Specifically, the ground terminal 321 and the shield layer 201 are connected by soldering.

The external connection terminal 320 (second connection terminal), which is the Hot terminal 322 of the second chip 302, is connected to the wiring layer 203 of the shield cover 200 (see FIG. 2). Specifically, the Hot terminal 322 and the wiring layer 203 are connected by soldering. A conduction path 160 provided in the conductive layer of the mount board 100 is electrically connected to the Hot terminal 322 via the wiring layer 203. The Hot terminal 322 is connected to the chip inductor 22 via the wiring layer 203 and the conduction path 160.

The multiple external connection terminals 310 of the first chip 301 are connected to the first main surface 101 of the mount board 100 by soldering.

(3) Communication Device

The communication device 500 according to this embodiment includes the radio-frequency module 1, the antenna 4, and the signal processing circuit 3 as illustrated in FIG. 3. The communication device 500 performs transmission and reception of signals via the antenna 4.

The signal processing circuit 3 processes signals that have passed or will pass through the radio-frequency module 1. The signal processing circuit 3 includes, for example, the RF signal processing circuit 5 and a baseband signal processing circuit 6.

The baseband signal processing circuit 6 is, for example, a BBIC (baseband integrated circuit) as illustrated in FIG. 3, and is electrically connected to the RF signal processing circuit 5. The baseband signal processing circuit 6 generates an I-phase signal and a Q-phase signal from a baseband signal. The baseband signal processing circuit 6 performs IQ modulation by combining the I-phase signal and the Q-phase signal and outputs a transmission signal. At that time, the transmission signal is generated as a modulation signal obtained by performing amplitude modulation upon a carrier signal of a predetermined frequency using a longer period than the period of the carrier signal.

The RF signal processing circuit 5 is, for example, an RFIC (radio-frequency integrated circuit) and is provided between the radio-frequency module 1 and the baseband signal processing circuit 6 as illustrated in FIG. 3. The RF signal processing circuit 5 has a function of performing signal processing upon the transmission signal from the baseband signal processing circuit 6 and a function of performing signal processing upon the reception signal received by the antenna 4. The RF signal processing circuit 5 is a multiband processing circuit and is capable of generating and amplifying the transmission signals in a plurality of communication bands.

The baseband signal processing circuit 6 is an optional constituent element in the communication device 500.

As described above, the radio-frequency module 1 according to this embodiment includes the mount board 100, the first chip 301, the second chip 302, and the shield cover 200 (cover). The first chip 301 is disposed on the mount board 100. The second chip 302 is disposed on the first chip 301. The cover covers at least parts of the first chip 301 and the second chip 302. The second chip 302 has, in the thickness direction D1 of the mount board 100, the ground terminal 321 (first connection terminal) on the opposite side from the first chip 301. The shield cover 200 includes the shield layer 201 connected to the ground. The ground terminal 321 is connected to the shield layer 201.

Since the second chip 302 is disposed, that is, stacked on the first chip 301 in this configuration, the radio-frequency module 1 can be miniaturized. Since the shield cover 200 covers at least parts of the first chip 301 and the second chip, the first chip 301 and the second chip are less susceptible to magnetic fields generated by other components such as an inductor. As a result, the reduction in quality of the radio-frequency module can be suppressed.

The laser printing of, for example, the product name is performed on the upper surface of the radio-frequency module (e.g., the upper surface of the first resin layer 150). In this case, the first chip 301 and the second chip 302, at least parts of which are covered by the shield cover 200, are less likely to be broken.

In the radio-frequency module 1 according to this embodiment, the shield cover 200 further includes the insulating layer 202 and the wiring layer 203. The shield layer 201, the insulating layer 202, and the wiring layer 203 of the shield cover 200 are stacked in this order from the surface to the inside of the shield cover 200. The second chip 302 further has, in the thickness direction D1, the Hot terminal 322 (second connection terminal) different from the above first connection terminal on the opposite side from the first chip 301. The Hot terminal 322 is connected to the wiring layer 203.

The Hot terminal 322 of the second chip 302 is connected to the mount board 100 via the wiring layer 203 in this configuration. As a method of connecting the Hot terminal 322 of the second chip 302 and the mount board 100, wire bonding is considered. In the case where the method is employed, a wire is used at a point of connection (first connection point) between the Hot terminal 322 and the mount board 100, and the wire is curved between the Hot terminal 322 and the first connection point. On the other hand, in this embodiment in which the wiring layer 203 of the shield cover 200 is used, a part of the path between the Hot terminal 322 and a point of connection (second connection point) between the mount board 100 and the shield cover 200 is provided on the side wall 211 of the shield cover 200. That is, the path can be partly bent. Accordingly, the linear distance between the Hot terminal 322 and the first connection point in the horizontal direction (direction orthogonal to the thickness direction D1) is longer than the linear distance between the Hot terminal 322 and the second connection point. That is, a smaller size can be achieved with the shield cover 200.

In the radio-frequency module 1 according to this embodiment, the region E1 surrounded by the shield cover 200 includes the cavity E2.

With this configuration, an air layer can be provided inside the shield cover 200. In this embodiment, the filters 31 and 32 are provided inside the shield cover 200. The filters 31 and 32 that are acoustic wave filters need an air layer to transmit signals. Accordingly, the air layer inside the shield cover 200 allows the first chip 301 (the filter 31) and the second chip 302 (the filter 32) provided inside the shield cover 200 to transmit signals.

(5) Modification

Modifications will be listed below. Modifications to be described below may be applied in appropriate combination with the above embodiment.

(5.1) First Modification

In the radio-frequency module 1 according to the above embodiment, the second resin layer 151 is provided on the second main surface 102 side of the mount board 100 to cover the IC chip 400 and other components disposed on the second main surface 102 as illustrated in FIG. 1B. The radio-frequency module 1 includes the multiple cylindrical external connection terminals 110 and is connected to the mother board via the multiple external connection terminals 110.

Figure 4:
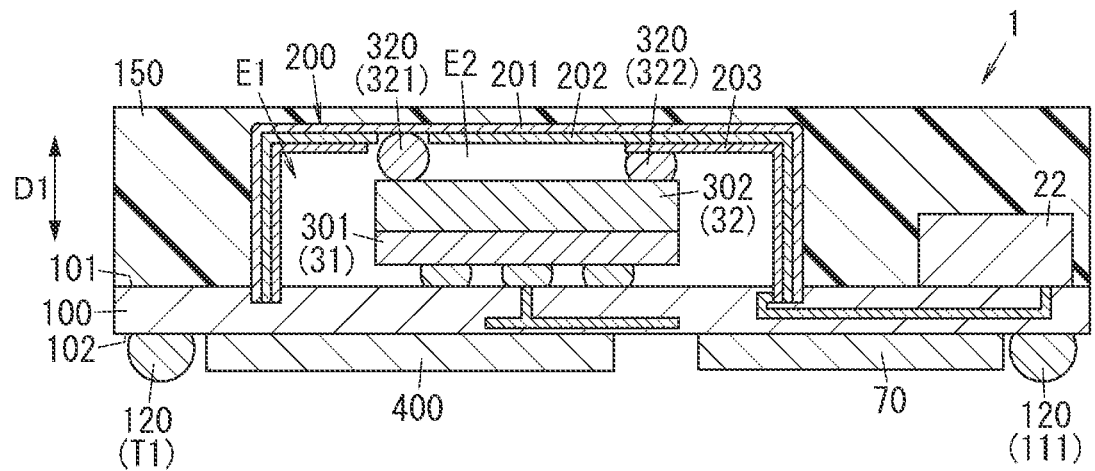
FIG. 4 is a schematic cross-sectional view of a radio-frequency module according to a first modification which describes the configuration of the radio-frequency module.

However, the second resin layer 151 may be omitted on the second main surface 102 side of the mount board 100, and the connection to the mother board may be made using a plurality of spherical external connection terminals 120 as illustrated in FIG. 4.

Each of the multiple external connection terminals 120 is, for example, a spherical ball bump. The material of the ball bump is, for example, gold, copper, or solder. The multiple external connection terminals 120 include the antenna terminal T1 and the multiple ground terminals 111.

The radio-frequency module 1 may include the multiple external connection terminals 110 and the multiple external connection terminals 120. In this case, the multiple external connection terminals 110 may include the antenna terminal T1, or the multiple external connection terminals 120 may include the antenna terminal T1. The multiple external connection terminals 110 may include the multiple ground terminals 111, or the multiple external connection terminals 120 may include the multiple ground terminals 111. Alternatively, both the multiple external connection terminals 110 and the multiple external connection terminals 120 may include the multiple ground terminals 111.

(5.2) Second Modification

The radio-frequency module 1 includes the mount board 100 having components disposed on both the first main surface 101 and the second main surface 102 facing each other in the thickness direction D1, but may not have this structure.

A mount board having components disposed on either the first main surface 101 or the second main surface 102 (e.g., the first main surface 101) may be used.

A mount board 100A in a radio-frequency module 1A according to this modification is, for example, a printed wiring board, an LTCC substrate, an HTCC substrate, or a resin substrate like the mount board 100. Here, the mount board 100A is, for example, a multilayer substrate including a plurality of dielectric layers and a plurality of conductive layers like the mount board 100. The mount board 100A is not limited to a printed wiring board and an LTCC substrate and may be a wiring structure. The mount board 100A has a first main surface 101A and a second main surface 102A facing each other in the thickness direction D1.

On the first main surface 101A, the first matching circuit 20, the filter group 30 (the filters 31 to 33), the second matching circuit 50, the third matching circuit 60, the IC chip 400, the power amplifier 70, and the shield cover 200 are disposed. The IC chip 400 includes the antenna switch 10, the low-noise amplifier 80, and the switch 40 like in the above embodiment.

The radio-frequency module 1A further includes the first resin layer 150. The first resin layer 150 covers respective electronic components disposed on the first main surface 101A.

Figure 5:
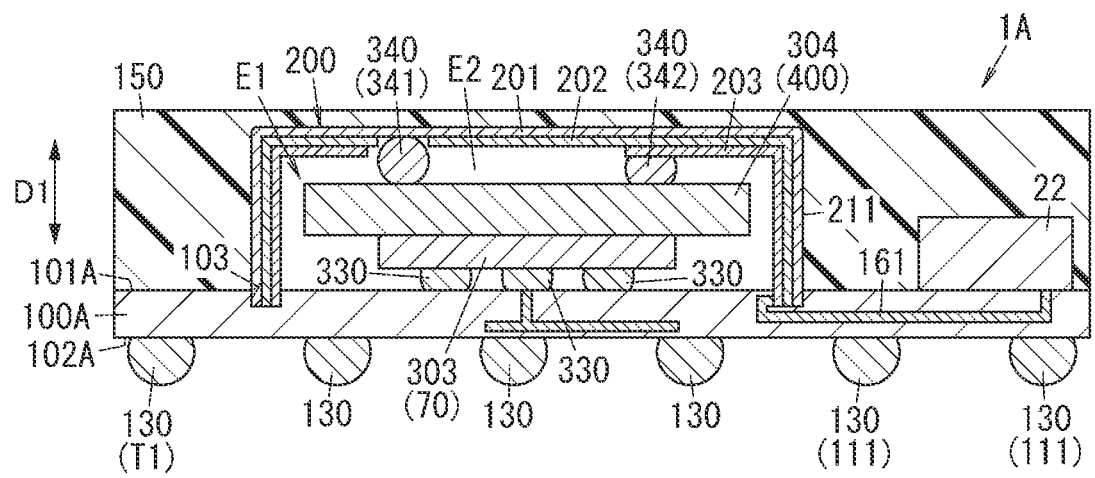
FIG. 5 is a schematic cross-sectional view of a radio-frequency module according to a second modification which describes the configuration of the radio-frequency module.

On the second main surface 102A facing the first main surface 101A in the thickness direction D1 of the mount board 100A, a plurality of external connection terminals 130 are provided (see FIG. 5). The multiple external connection terminals 130 connect the radio-frequency module 1A to a mother board on which the signal processing circuit 3 and other components are disposed. The multiple external connection terminals 130 are spherical ball bumps. The material of the ball bump is, for example, gold, copper, or solder. The multiple external connection terminals 130 include the antenna terminal T1 and the multiple (two in the drawing) ground terminals 111.

In this modification, the shield cover 200 may cover the stacked filters 31 and 32 or other two stacked chips.

For example, as illustrated in FIG. 5, the shield cover 200 may cover the IC chip 400 and the power amplifier 70 stacked in the thickness direction D1.

In this case, the power amplifier 70 is a first chip 303 formed as one chip. The first chip 303 (the power amplifier 70) is disposed on the mount board 100A. The IC chip 400 is a second chip 304 formed as one chip. The second chip 304 (the IC chip 400) is disposed on the first chip 303. That is, the first chip 303 and the second chip 304 are stacked in this order on the mount board 100A. The first chip 303 and the second chip 304 are connected by die bonding.

The second chip 304 includes, in the thickness direction D1 of the mount board 100A, a plurality of external connection terminals 340 on the opposite side from the first chip 303. The multiple external connection terminals 340 include a ground terminal 341 (first connection terminal) and a Hot terminal 342 (second connection terminal) electrically connected to another electronic component. In this modification, the Hot terminal 342 is connected to the selection terminal 13 of the antenna switch 10 in the second chip 304 (the IC chip 400).

The first chip 303 includes, in the thickness direction D1 of the mount board 100A, a plurality of external connection terminals 330 (third connection terminals) on the opposite side from the second chip 304. The multiple external connection terminals 330 include the ground terminal and the Hot terminal.

The shield cover 200 covers at least parts of the first chip 303 and the second chip 304. In this modification, the shield cover 200 covers the whole of the first chip 303 and the second chip 304.

The shield cover 200 is disposed on (connected to) the mount board 100A in such a manner that the end of the side surface thereof forming the side wall 211 of the shield cover 200 is fitted into and soldered to the rectangular groove 103 provided in the mount board 100A. In this modification, the region E1 surrounded by the shield cover 200 disposed on the mount board 100A includes the cavity E2.

The external connection terminal 340 (the first connection terminal), which is the ground terminal 341 of the second chip 304, is connected to the shield layer 201 of the shield cover 200 (see FIG. 5). Specifically, the ground terminal 341 and the shield layer 201 are connected by soldering.

The external connection terminal 340 (the second connection terminal), which is the Hot terminal 342 of the second chip 304, is connected to the wiring layer 203 of the shield cover 200 (see FIG. 5). Specifically, the Hot terminal 342 and the wiring layer 203 are connected by soldering. A conduction path 161 provided in the conductive layer of the mount board 100A and the Hot terminal 342 are electrically connected via the wiring layer 203. The Hot terminal 342 is connected to the chip inductor 22 via the wiring layer 203 and the conduction path 161. That is, the selection terminal 13 of the antenna switch 10 is connected to the chip inductor 22 via the wiring layer 203 and the conduction path 161.

The multiple external connection terminals 330 of the first chip 303 are connected to the first main surface 101A of the mount board 100A by soldering.

(5.3) Third Modification

The shield cover 200 covers the whole of the first chip 301 and the second chip 302 in the above embodiment, but may not have this structure.

A structure may be employed in which a part of at least one of the chips: the first chip 301 (the filter 31) and the second chip 302 (the filter 32) is not covered with the shield cover 200, that is, is exposed.

Figure 6:
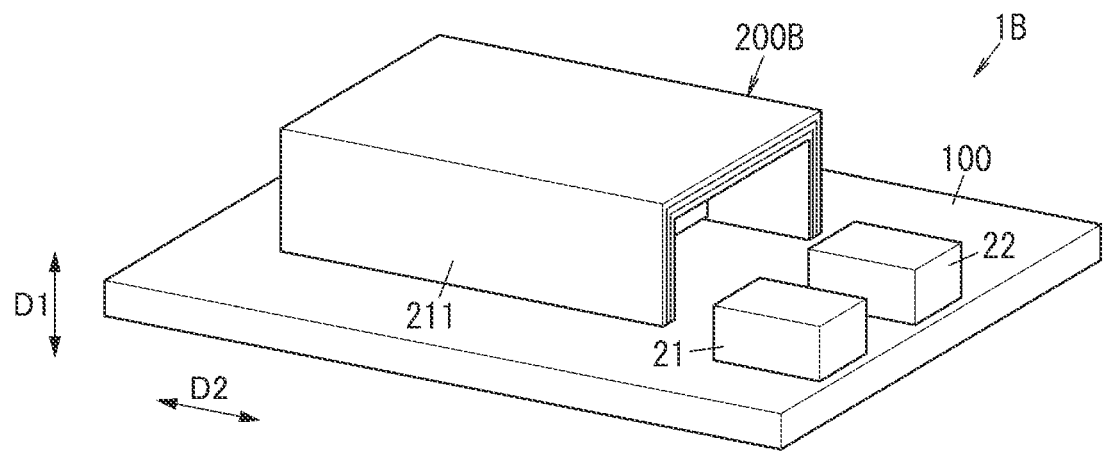
FIG. 6 is a schematic cross-sectional view of a radio-frequency module according to a third modification which describes the configuration of the radio-frequency module.

A shield cover 200B included in a radio-frequency module 1B according to this modification may be shaped such that one surface thereof in a direction D2 orthogonal to the thickness direction D1 of the mount board 100 opens (see FIG. 6). In summary, a structure may be employed in which a shield cover 200B (200) covers at least parts of the first chip 301 and the second chip 302. That is, the shield cover 200B (200) may cover the whole of both the first chip 301 and the second chip 302 or expose a part of at least one of the chips: the first chip 301 and the second chip 302.

For example, the shield cover 200B (200) may cover the whole of both the first chip 301 and the second chip 302, only the first chip 301, or only the second chip 302. Alternatively, the shield cover 200B (200) may cover a part of the first chip 301 and a part of the second chip 302, cover a part of the first chip 301 and the whole of the second chip 302, or cover the whole of the first chip 301 and the whole of the second chip 302.

This modification may be applied to the first and second modifications. For example, when this modification is applied to the second modification, a part of at least one of the chips: the first chip 303 (the power amplifier 70) and the second chip 304 (the IC chip 400) is not covered with the shield cover 200B.

(5.4) Fourth Modification

The first resin layer 150 and the second resin layer 151 are optional constituent elements in the above embodiment. The radio-frequency module 1 may not include the first resin layer 150 and the second resin layer 151.

In the radio-frequency module 1A according to the second modification, the first resin layer 150 is also an optional constituent element.

(5.5) Fifth Modification

In the above embodiment, a cavity is present inside the shield cover 200. However, a resin layer may be provided inside the shield cover 200.

(5.6) Sixth Modification

The filters 31 to 33 are SAW filters in the above embodiment, but may not be SAW filters.

The filters 31 to 33 may be other acoustic wave filters using, for example, boundary acoustic waves or Lamb waves. For example, the filters 31 to 33 may be BAW (bulk acoustic wave) filters. Alternatively, the multiple filters 31 to 33 may be formed of, for example, FBARs (film bulk acoustic resonators) or LC resonance circuits.

(5.7) Seventh Modification

The mount board 100 is a printed wiring board, an LTCC substrate, an HTCC substrate, or a resin substrate in the above embodiment, but may not have this structure. The mount board 100 may be a component built-in substrate.

The mount board 100A according to the second modification and the mount board 100 according to the third modification may also be component built-in substrates.

(5.8) Eighth Modification

In the above embodiment, the antenna switch 10, the switch 40, and the low-noise amplifier 80 are included in the IC chip 400, that is, are formed as one chip. However, this structure may not be employed.

The antenna switch 10, the switch 40, and the low-noise amplifier 80 may not be formed as one chip, and may be separately disposed on the second main surface 102. Alternatively, two constituent elements selected from among the antenna switch 10, the switch 40, and the low-noise amplifier 80 may be formed as one chip.

(5.9) Ninth Modification

The shield cover 200 includes three layers: the shield layer 201, the insulating layer 202, and the wiring layer 203 in the above embodiment, but may not have this structure.

The shield cover 200 may be formed by the shield layer 201. In this case, the Hot terminal 322 of the second chip 302 is connected to the mount board 100 via a through hole provided in the first chip 301.

(5.10) Tenth Modification

The two chips (the first chip 301 (303) and the second chip 302 (304)) are stacked and placed in the shield cover 200 in the above embodiment, but this structure may not be employed.

Three or more chips may be stacked and placed in the shield cover 200. In this case, the lowermost chip (the chip connected to the mount board 100) of the three or more stacked chips corresponds to the first chip 301 (303), and the uppermost chip corresponds to the second chip 302 (304).

(Summarization)

As described above, a radio-frequency module (1, 1A, or 1B) according to a first aspect includes a mount board (100 or 100A) on which a ground terminal (111) is disposed, a first chip (301 or 303), a second chip (302 or 304), and a cover (the shield cover 200 or 200B). The first chip (301 or 303) is disposed on the mount board (100 or 100A). The second chip (302 or 304) is disposed on the first chip (301 or 303). The cover covers at least a part of the first chip (301 or 303) and at least a part of the second chip (302 or 304). The second chip (302 or 304) has a first connection terminal (e.g., the ground terminal 321 or 341) on the opposite side from the first chip (301 or 303) in a thickness direction (D1) of the mount board (100 or 100A). The cover includes a shield layer (201) connected to the ground terminal (111) disposed on the mount board (100 or 100A). The first connection terminal is connected to the shield layer (201).

With this configuration, miniaturization can be achieved and quality deterioration can be suppressed. When laser printing is performed upon the upper surface of the radio-frequency module, the first chip (301 or 303) and the second chip (302 or 304) are less likely to be broken with this configuration.

In a radio-frequency module (1, 1A, or 1B) according to a second aspect, the cover further includes an insulating layer (202) and a wiring layer (203) in the first aspect. The shield layer (201), the insulating layer (202), and the wiring layer (203) of the cover are stacked in this order from the outer surface to the inside of the cover. The second chip (302 or 304) further has a second connection terminal (e.g., the Hot terminal 322) different from the first connection terminal on the opposite side from the first chip (301 or 303) in the thickness direction (D1). The second connection terminal is connected to the wiring layer (203).

As compared with the case where the second connection terminal of the second chip (302) is connected to the mount board (100 or 100A) by wire bonding, a smaller size can be achieved with this configuration.

In a radio-frequency module (1, 1A, or 1B) according to a third aspect, the first chip (301 or 302) has a third connection terminal (e.g., the external connection terminal 310 or 330) on the opposite side from the second chip (302 or 304) in the thickness direction (D1) in the first or second aspect.

With this configuration, the third connection terminal can be connected to the mount board (100 or 100A).

A radio-frequency module (1, 1A, or 1B) according to a fourth aspect further includes a plurality of external connection terminals (110, 120, or 130) including the ground terminal (111) in any one of the first to third aspects. The mount board (1, 1A, or 1B) has a first main surface (101 or 101A) and a second main surface (102 or 102A) facing each other. The multiple external connection terminals (110, 120, or 130) are disposed on the second main surface (102 or 102A). The first chip (301 or 303), the second chip (302 or 304), and the cover are disposed on the first main surface (101 or 101A).

With this configuration, a cover can be provided on a surface (the first main surface (101 or 101A)) opposite to a surface (the second main surface (102 or 102A)) on which the multiple external connection terminals (110, 120, or 130) are provided.

In a radio-frequency module (1, 1A, or 1B) according to a fifth aspect, the first connection terminal and the shield layer (201) are connected by soldering in any one of the first to fourth aspects.

With this configuration, the first connection terminal and the shield layer (201) can be easily connected.

In a radio-frequency module (1A or 1B) according to a sixth aspect, the first chip (303) includes a power amplifier (70) in any one of the first to fifth aspects. The second chip (304) includes a switch (e.g., the antenna switch 10) configured to select at least one of signal paths for a plurality of communication bands as a signal path to be connected to an antenna (4).

With this configuration, miniaturization can be achieved and quality deterioration can be suppressed by stacking the power amplifier (70) and the switch. Furthermore, when laser printing is performed upon the upper surface of the radio-frequency module, the power amplifier (70) and the switch are less likely to be broken by the laser printing with this configuration.

In a radio-frequency module (1 or 1B) according to a seventh aspect, the first chip (301) includes a first filter (e.g., the filter 31) configured to pass a signal in a first communication band in any one of the first to fifth aspects. The second chip (302) includes a second filter (e.g., the filter 32) configured to pass a signal in a second communication band different from the first communication band.

With this configuration, miniaturization can be achieved and quality deterioration can be suppressed by stacking the first filter and the second filter. Furthermore, when laser printing is performed upon the upper surface of the radio-frequency module, the first filter and the second filter are less likely to be broken by the laser printing with this configuration.

In a radio-frequency module (1, 1A, or 1B) according to an eighth aspect, a region (E1) surrounded by the cover has a cavity (E2) in any one of the first to seventh aspects.

With this configuration, an air layer that is the cavity (E2) can be placed in the region (E1) surrounded by the shield cover (200).

In a radio-frequency module (1 or 1A) according to a ninth aspect, the cover covers the whole of the first chip (301 or 303) and the whole of the second chip (302 or 303) in any one of the first to eighth aspects.

With this configuration, miniaturization can be achieved and quality deterioration can be further suppressed. Furthermore, when laser printing is performed upon the upper surface of the radio-frequency module, the first chip (301 or 303) and the second chip (302 or 303) are less likely to be broken by the laser printing with this configuration.

A communication device (500) according to a tenth aspect includes the radio-frequency module (1, 1A, or 1B) according to any one of the first to ninth aspects and a signal processing circuit (3) configured to process a signal used for communication.

With this configuration, miniaturization can be achieved and quality deterioration can be suppressed. Furthermore, when laser printing is performed upon the upper surface of the radio-frequency module, the first chip (301 or 303) and the second chip (302 or 304) are less likely to be broken by the laser printing with this configuration.

1, 1A, and 1B radio-frequency module
3 signal processing circuit
4 antenna
5 RF signal processing circuit
6 baseband signal processing circuit
10 antenna switch
11, 42, and 46 common terminal
12, 13, 14, 43a, 43b, 43c, 47a, 47b, and 47c selection terminal
20 first matching circuit
21, 22, 23, 61, and 62 chip inductor
30 filter group
31, 32, and 33 filter
40 switch
41 first switch
45 second switch
50 second matching circuit
51 and 52 inductor
53, 54, and 55 capacitor
60 third matching circuit
70 power amplifier
71 and 82 output terminal
72 and 81 input terminal
80 low-noise amplifier
100, 100A, and 100B mount board
101 and 101A first main surface
102 and 102A second main surface
103 groove
110, 120, and 130 external connection terminal
111 ground terminal
150 first resin layer
151 second resin layer
160 and 161 conduction path
200 and 200B shield cover
201 shield layer
202 insulating layer
203 wiring layer
211 side wall
301 and 303 first chip
302 and 304 second chip
310, 320, 330, and 340 external connection terminal
321 and 341 ground terminal
322 and 342 Hot terminal
400 IC chip
500 communication device
D1 thickness direction
D2 direction
E1 region
IC switch
IC400 chip
T1 antenna terminal

The invention claimed is:

1. A radio-frequency module comprising:
a mount board on which a ground terminal is disposed;
a first chip disposed on the mount board;
a second chip disposed on the first chip; and
a cover covering at least a part of the first chip and at least a part of the second chip,
wherein the second chip has a first connection terminal on an opposite side from the first chip in a thickness direction of the mount board,
wherein the cover includes a shield layer connected to the ground terminal disposed on the mount board, and
wherein the first connection terminal is connected to the shield layer.

2. The radio-frequency module according to claim 1,
wherein the cover further includes an insulating layer and a wiring layer,
wherein the shield layer, the insulating layer, and the wiring layer of the cover are stacked in this order from an outer surface to an inside of the cover,
wherein the second chip further has a second connection terminal different from the first connection terminal on an opposite side from the first chip in the thickness direction, and
wherein the second connection terminal is connected to the wiring layer.

3. The radio-frequency module according to claim 1, wherein the first chip has a third connection terminal on an opposite side from the second chip in the thickness direction.

4. The radio-frequency module according to claim 1, further comprising a plurality of external connection terminals including the ground terminal,
wherein the mount board has a first main surface and a second main surface facing each other,
wherein the plurality of external connection terminals are disposed on the second main surface, and
wherein the first chip, the second chip, and the cover are disposed on the first main surface.

5. The radio-frequency module according to claim 1, wherein the first connection terminal and the shield layer are connected by soldering.

6. The radio-frequency module according to claim 1,
wherein the first chip includes a power amplifier, and
wherein the second chip includes a switch configured to select at least one of signal paths for a plurality of communication bands as a signal path to be connected to an antenna.

7. The radio-frequency module according to claim 1,
wherein the first chip includes a first filter configured to pass a first signal in a first communication band, and
wherein the second chip includes a second filter configured to pass a second signal in a second communication band different from the first communication band.

8. The radio-frequency module according to claim 1, wherein a region surrounded by the cover has a cavity.

9. The radio-frequency module according to claim 1, wherein the cover covers a whole of the first chip and a whole of the second chip.

10. A communication device comprising:
the radio-frequency module according to claim 1; and
a signal processing circuit configured to process a signal used for communication.

11. The radio-frequency module according to claim 2, wherein the first chip has a third connection terminal on an opposite side from the second chip in the thickness direction.

12. The radio-frequency module according to claim 2, further comprising a plurality of external connection terminals including the ground terminal,
wherein the mount board has a first main surface and a second main surface facing each other,
wherein the plurality of external connection terminals are disposed on the second main surface, and
wherein the first chip, the second chip, and the cover are disposed on the first main surface.

13. The radio-frequency module according to claim 3, further comprising a plurality of external connection terminals including the ground terminal,
wherein the mount board has a first main surface and a second main surface facing each other,
wherein the plurality of external connection terminals are disposed on the second main surface, and
wherein the first chip, the second chip, and the cover are disposed on the first main surface.

14. The radio-frequency module according to claim 2, wherein the first connection terminal and the shield layer are connected by soldering.

15. The radio-frequency module according to claim 3, wherein the first connection terminal and the shield layer are connected by soldering.

16. The radio-frequency module according to claim 4, wherein the first connection terminal and the shield layer are connected by soldering.

17. The radio-frequency module according to claim 2,
wherein the first chip includes a power amplifier, and
wherein the second chip includes a switch configured to select at least one of signal paths for a plurality of communication bands as a signal path to be connected to an antenna.

18. The radio-frequency module according to claim 3,
wherein the first chip includes a power amplifier, and
wherein the second chip includes a switch configured to select at least one of signal paths for a plurality of communication bands as a signal path to be connected to an antenna.

19. The radio-frequency module according to claim 4,
wherein the first chip includes a power amplifier, and
wherein the second chip includes a switch configured to select at least one of signal paths for a plurality of communication bands as a signal path to be connected to an antenna.

20. The radio-frequency module according to claim 5,
wherein the first chip includes a power amplifier, and
wherein the second chip includes a switch configured to select at least one of signal paths for a plurality of communication bands as a signal path to be connected to an antenna.

* * * * *